(12) United States Patent
Preisler et al.

(10) Patent No.: US 9,673,191 B2
(45) Date of Patent: Jun. 6, 2017

(54) EFFICIENT FABRICATION OF BICMOS DEVICES

(71) Applicant: Newport Fab, LLC, Newport Beach, CA (US)

(72) Inventors: Edward Preisler, San Clemente, CA (US); Todd Thibeault, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 14/659,929

(22) Filed: Mar. 17, 2015

(65) Prior Publication Data

US 2015/0303186 A1 Oct. 22, 2015

Related U.S. Application Data

(60) Provisional application No. 61/980,226, filed on Apr. 16, 2014.

(51) Int. Cl.
| | |
|---|---|
| *H01L 27/06* | (2006.01) |
| *H01L 21/8249* | (2006.01) |
| *H01L 29/161* | (2006.01) |
| *H01L 29/417* | (2006.01) |
| *H01L 27/102* | (2006.01) |
| *H01L 29/165* | (2006.01) |

(52) U.S. Cl.
CPC ...... *H01L 27/0623* (2013.01); *H01L 21/8249* (2013.01); *H01L 27/102* (2013.01); *H01L 27/1022* (2013.01); *H01L 29/161* (2013.01); *H01L 29/165* (2013.01); *H01L 29/41708* (2013.01)

(58) Field of Classification Search
CPC ............... H01L 27/0623; H01L 27/102; H01L 27/1022; H01L 21/8249
See application file for complete search history.

(56) References Cited

U.S. PATENT DOCUMENTS

| | | |
|---|---|---|
| 5,342,794 A | 8/1994 | Wei |
| 5,930,635 A | 7/1999 | Bashir |
| 6,830,967 B1 * | 12/2004 | Yin ...................... H01L 21/8249 257/E21.696 |
| 6,933,202 B1 | 8/2005 | Hurwitz |
| 7,335,547 B1 | 2/2008 | U'Ren |
| 2005/0054170 A1 | 3/2005 | Steinmann |
| 2007/0013031 A1 | 1/2007 | Gray |
| 2007/0134854 A1 * | 6/2007 | Zhang ............... H01L 21/82285 438/142 |

(Continued)

*Primary Examiner* — Phat X Cao
(74) *Attorney, Agent, or Firm* — Farjami & Farjami LLP (57) ABSTRACT

A bipolar complementary-metal-oxide-semiconductor (BiCMOS) device is disclosed. The BiCMOS device includes a CMOS device in a CMOS region, a PNP bipolar device in a bipolar region, and a spacer clear region defined by an opening in a common spacer layer over the CMOS region and the bipolar region, wherein a sub-collector, a selectively implanted collector, and a base of the PNP bipolar device are formed in the spacer clear region. The PNP bipolar device further includes a collector sinker adjacent to the spacer clear region and electrically connected to the sub-collector of the PNP bipolar device. The BiCMOS device can further include an NPN bipolar device having a sub-collector, a selectively implanted collector and a base in another spacer clear region.

17 Claims, 10 Drawing Sheets

(56) References Cited

U.S. PATENT DOCUMENTS

| | | |
|---|---|---|
| 2008/0227262 A1 | 9/2008 | El-Kareh |
| 2008/0316659 A1 | 12/2008 | Oguzman |
| 2010/0019326 A1* | 1/2010 | Knoll ................ H01L 21/82285 |
| | | 257/370 |
| 2010/0032766 A1 | 2/2010 | Chen |
| 2012/0018811 A1 | 1/2012 | Yeh |

* cited by examiner

EFFICIENT FABRICATION OF BICMOS DEVICES

The present application claims the benefit of and priority to a provisional patent application entitled "Efficient BiCMOS Integration Scheme", Ser. No. 61/980,226 filed on Apr. 16, 2014. The disclosure in that provisional application is hereby incorporated fully by reference into the present application.

BACKGROUND

In complementary bipolar complementary-metal-oxide semiconductor (BiCMOS) fabrication processes, bipolar devices and CMOS devices are integrated on the same semiconductor substrate. High performance bipolar devices, such as NPN and PNP silicon-germanium (SiGe) bipolar transistors, require a high mask count when integrated on the same semiconductor substrate as the CMOS devices. As BiCMOS technology continues to advance in an effort to achieve high performance, such as increased speed, frequency response and gain, and reduced power consumption, semiconductor manufacturers are challenged to provide a complementary BiCMOS process that effectively integrates higher performing bipolar and CMOS devices.

In one approach of complementary BiCMOS process flow, when forming a bipolar device (e.g., a PNP device), a collector of the bipolar device is formed, for example, by implanting a P type dopant. Consequently, at least one masking layer is required to form the collector when implanting the P type dopant. Thereafter, an insulating layer is formed over the collector of the bipolar device. To form a base for the bipolar device over the collector, a window opening needs to be formed by, for example, etching away a portion of the insulating layer above the collector. Thus, another masking layer is required over the insulating layer to form the window opening for the deposition of the base layer. A similar process is used to form the other bipolar device (e.g., an NPN device) during the complementary BiCMOS process flow. Thus, the formations of the bases and the collectors for the complementary bipolar devices require separate implanting steps and a number of masking layers. These steps in the complementary BiCMOS process undesirably add to processing complexity and manufacturing cost.

Thus, there is a need in the art for a complementary BiCMOS process for efficiently integrating complementary bipolar devices, such as SiGe NPN and PNP devices, with CMOS devices without undesirably increasing processing complexity and manufacturing cost.

SUMMARY

The present disclosure is directed to efficient fabrication of bipolar complementary-metal-oxide-semiconductor (BiCMOS) devices, substantially as shown in and/or described in connection with at least one of the figures, and as set forth in the claims.

DESCRIPTION OF EXEMPLARY IMPLEMENTATIONS

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1:
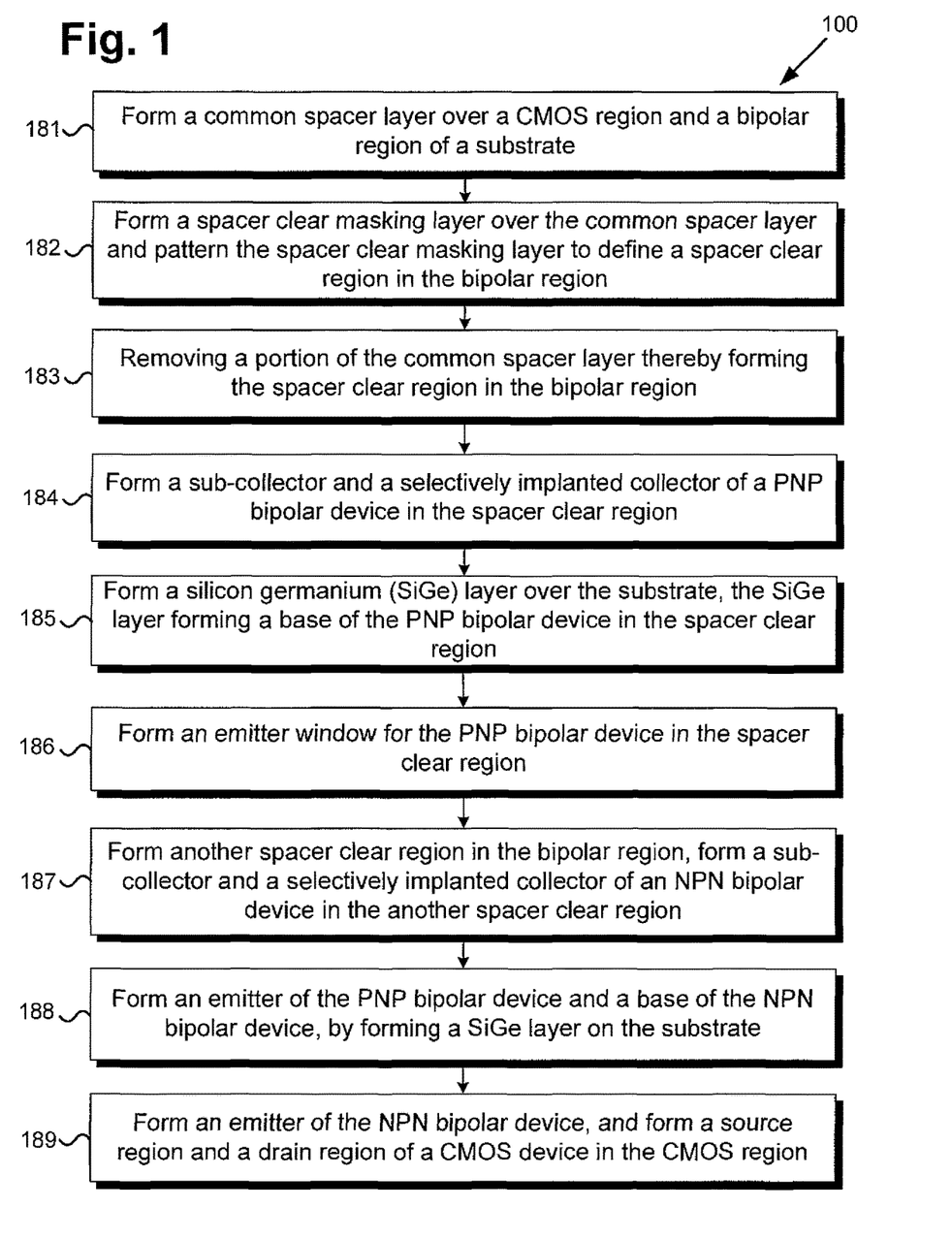
FIG. 1 is a flowchart illustrating a method for fabricating a bipolar complementary-metal-oxide-semiconductor (BiCMOS) device according to one implementation of the present application.

FIG. 1 shows an exemplary diagram illustrating an exemplary method for fabricating a bipolar complementary-metal-oxide-semiconductor (BiCMOS) device, according to one implementation of the present inventive concepts. Certain details and features have been left out of flowchart 100 that are apparent to a person of ordinary skill in the art. For example, an action may comprise one or more sub actions or may involve specialized equipment or materials, as is known in the art. While actions 181 through 189 indicated in flowchart 100 are sufficient to describe one implementation disclosed herein, other implementations disclosed herein may use actions different from those shown in flowchart 100.

As illustrated in flowchart 100, action 181 includes forming a common spacer layer over a CMOS region and a bipolar region of a semiconductor substrate. Action 182 includes forming a spacer clear masking layer over the common spacer layer and pattern the spacer clear masking layer to define a spacer clear region in the bipolar region.

Action 183 includes removing a portion of the common spacer layer thereby forming the spacer clear region in the bipolar region. Action 184 includes forming a sub-collector and a selectively implanted collector (also known and referred to in the art simply as a "collector") of a PNP bipolar device in the spacer clear region. Action 185 includes forming a silicon germanium (SiGe) layer over the semiconductor substrate, the SiGe layer forming a base of the PNP bipolar device in the spacer clear region. Action 186 includes forming an emitter window for the PNP bipolar device in the spacer clear region. Action 187 includes forming another spacer clear region in the bipolar region, form a sub-collector and a selectively implanted collector (also known and referred to in the art simply as a "collector") of an NPN bipolar device in the another spacer clear region. Action 188 includes forming an emitter of the PNP bipolar device and a base of the NPN bipolar device, by forming a SiGe layer on the semiconductor substrate. Action 189 includes forming an emitter of the NPN bipolar device, and form a source region and a drain region of a CMOS device in the CMOS region.

Figure 2A:
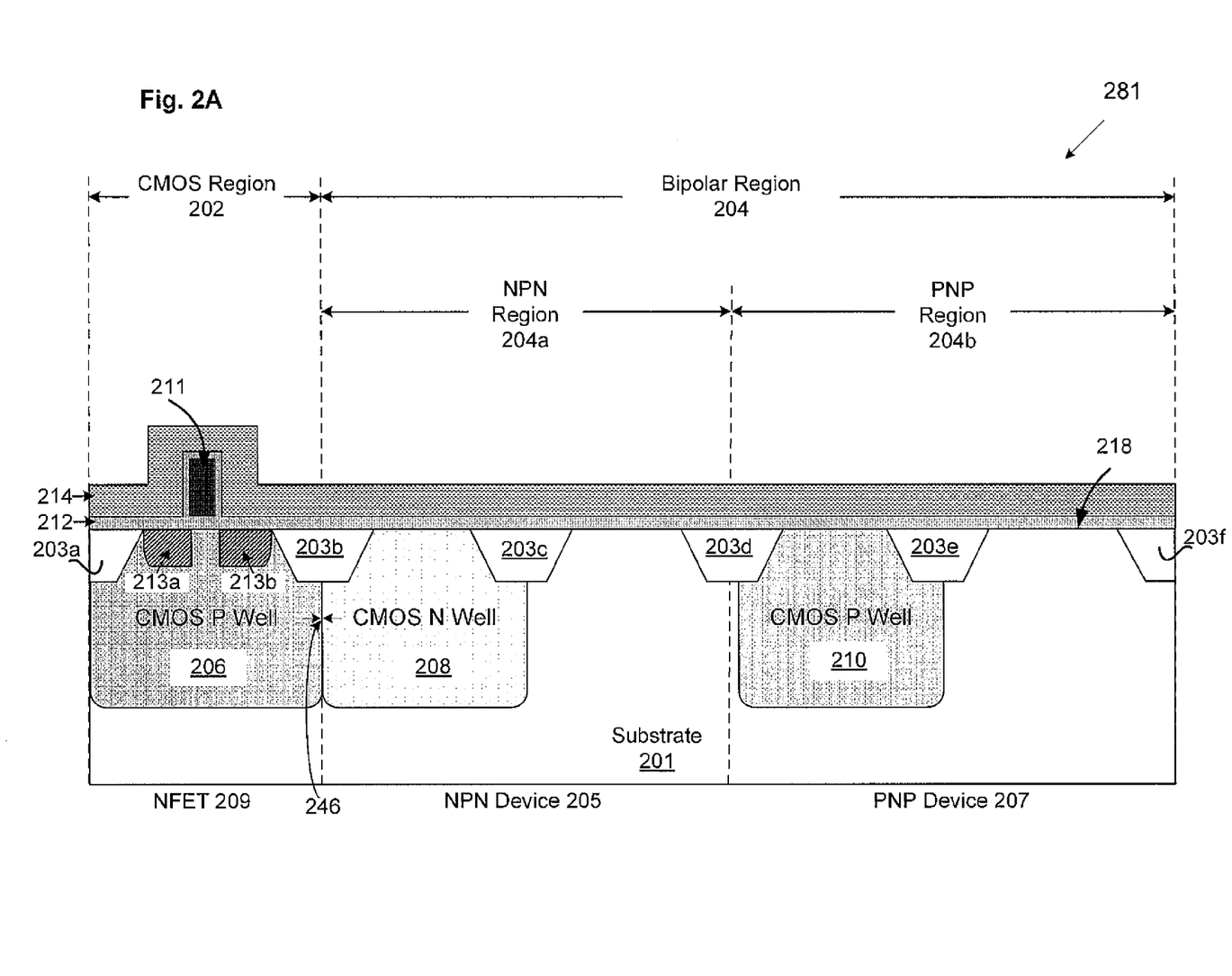
FIG. 2A illustrates a cross-sectional view of a portion of a semiconductor structure processed in accordance with an initial action in the flowchart of FIG. 1 according to one implementation of the present application.
Figure 2B:
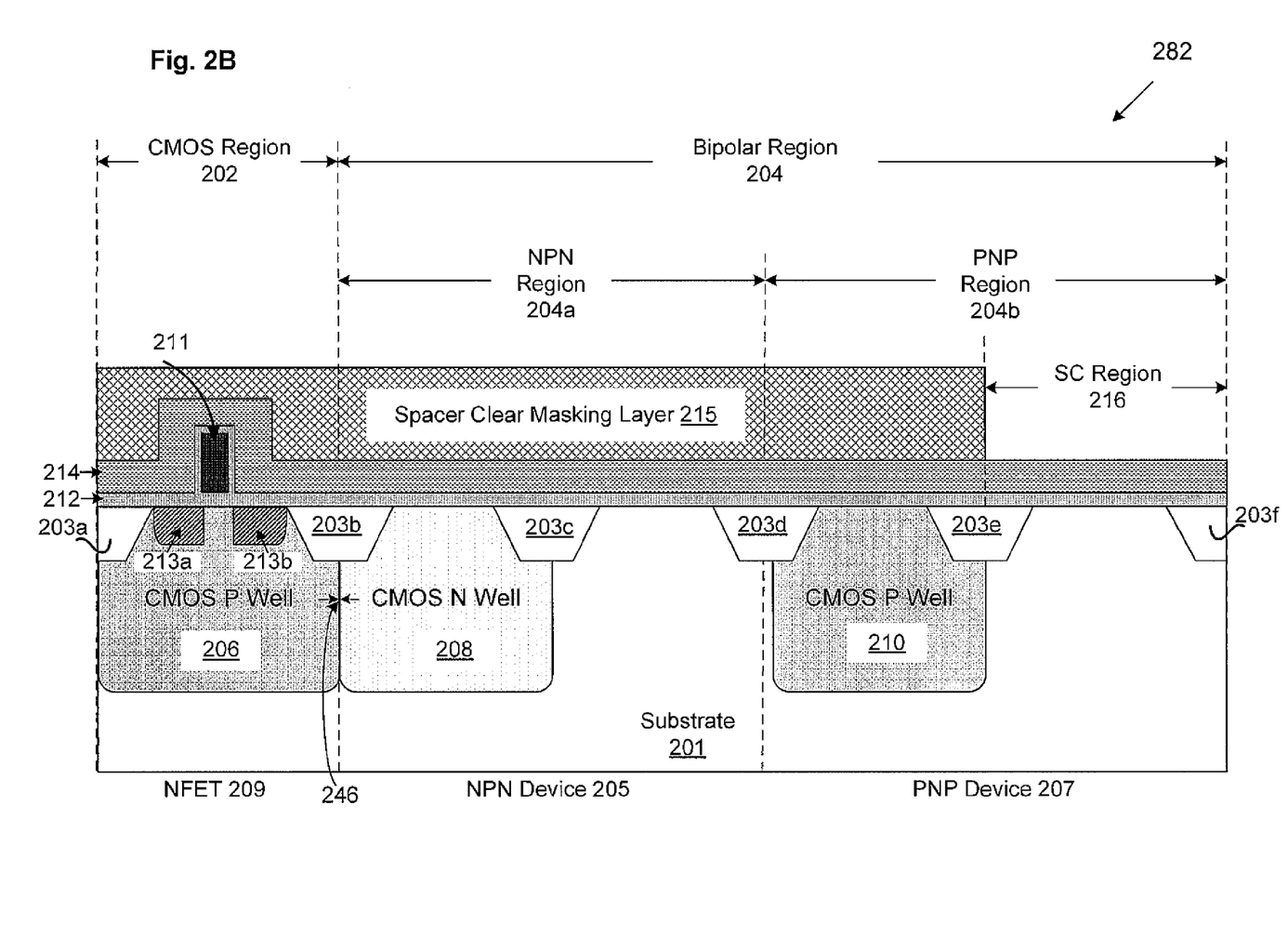
FIG. 2B illustrates a cross-sectional view of a portion of a semiconductor structure processed in accordance with an intermediate action in the flowchart of FIG. 1 according to one implementation of the present application.
Figure 2C:
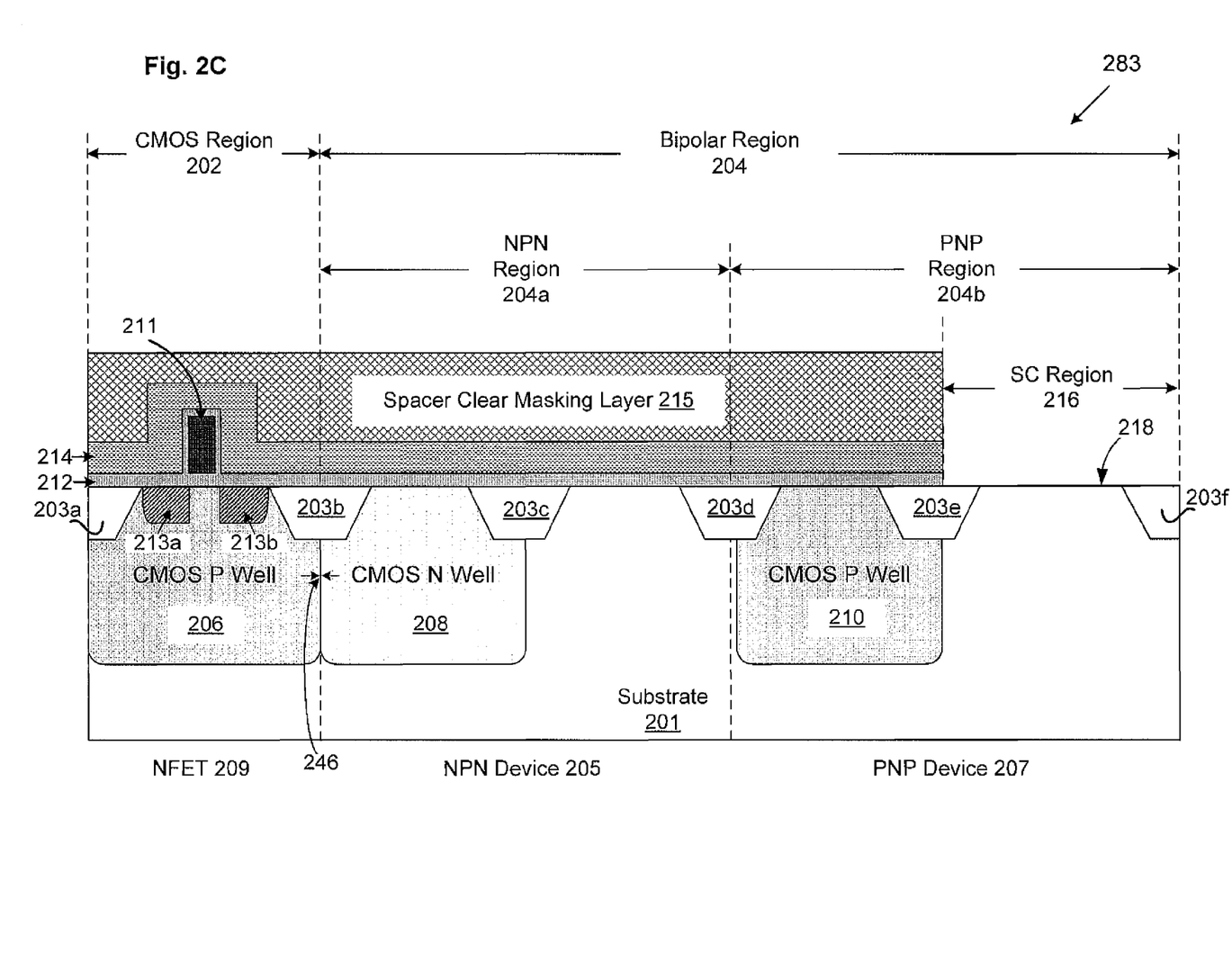
FIG. 2C illustrates a cross-sectional view of a portion of a semiconductor structure processed in accordance with an intermediate action in the flowchart of FIG. 1 according to one implementation of the present application.
Figure 2D:
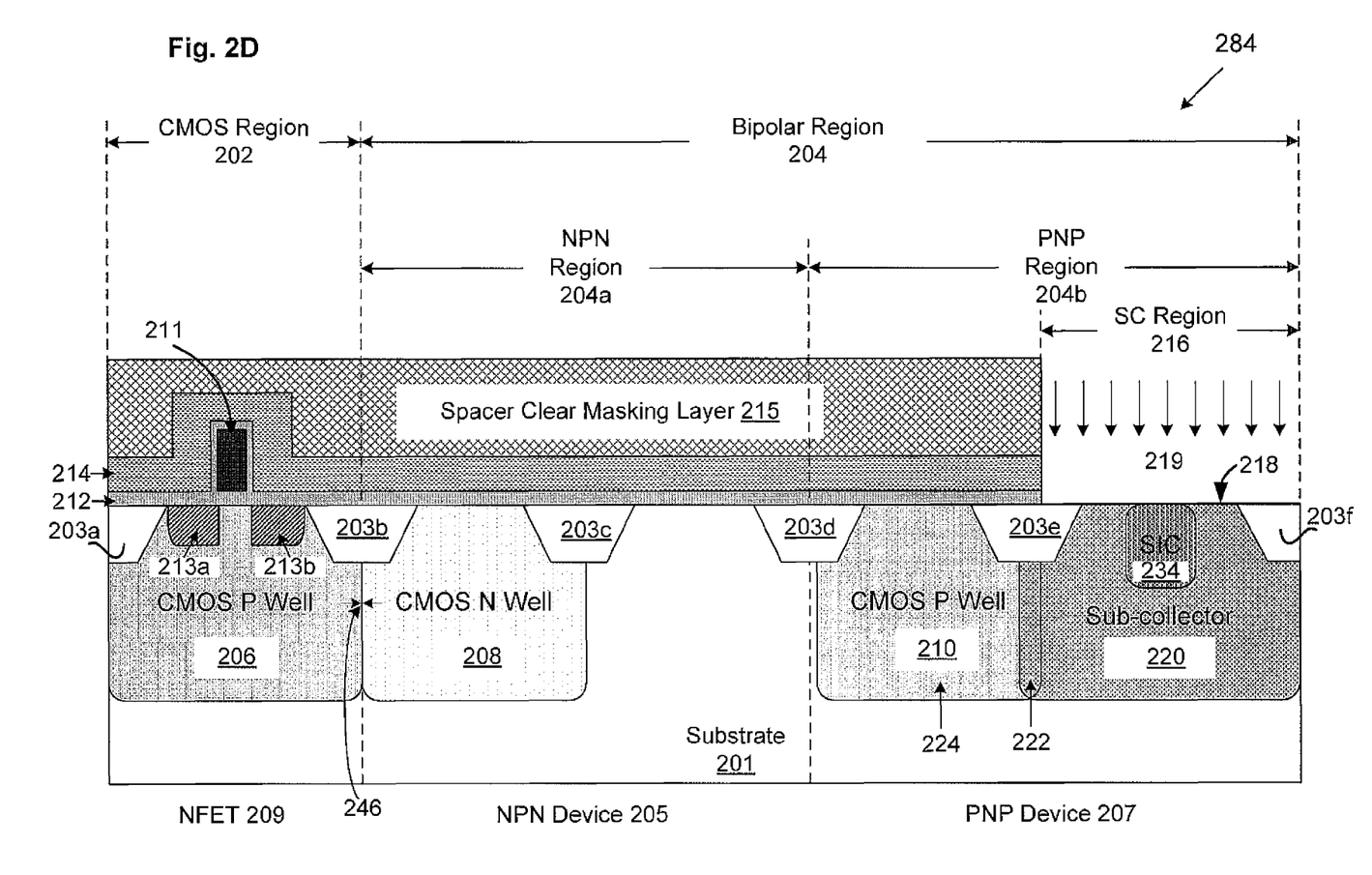
FIG. 2D illustrates a cross-sectional view of a portion of a semiconductor structure processed in accordance with an intermediate action in the flowchart of FIG. 1 according to one implementation of the present application.
Figure 2E:
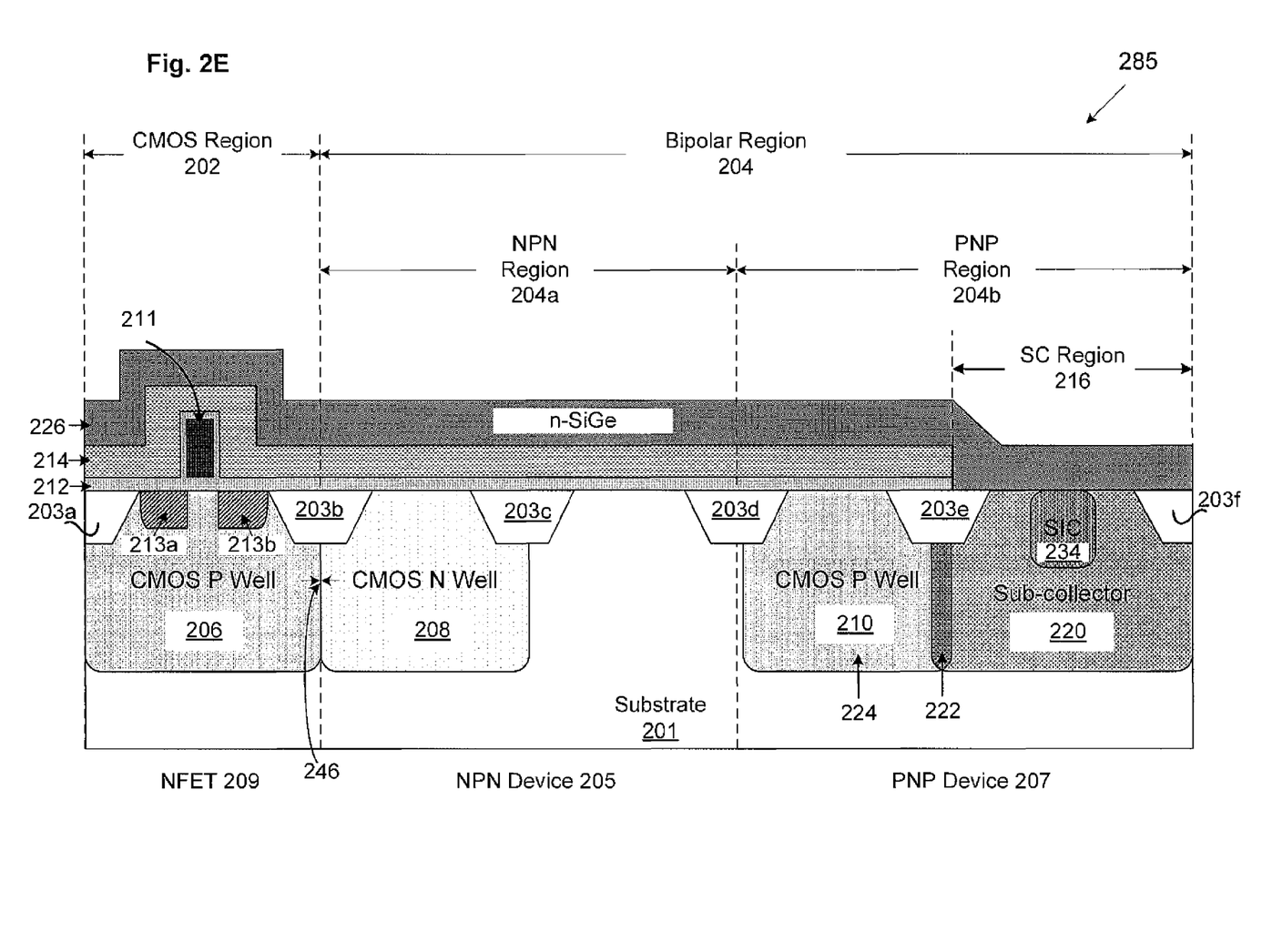
FIG. 2E illustrates a cross-sectional view of a portion of a semiconductor structure processed in accordance with an intermediate action in the flowchart of FIG. 1 according to one implementation of the present application.
Figure 2F:
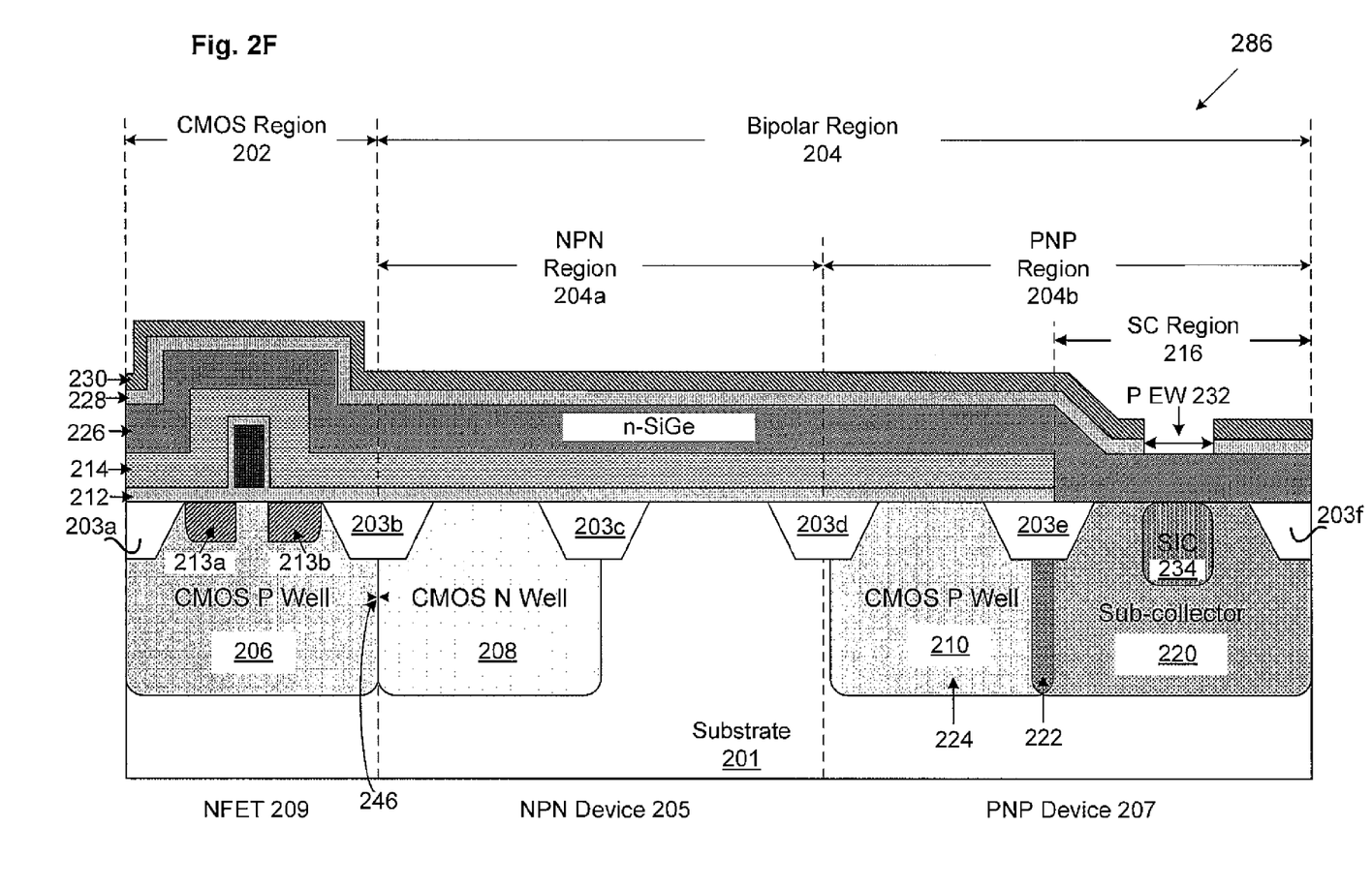
FIG. 2F illustrates a cross-sectional view of a portion of a semiconductor structure processed in accordance with an intermediate action in the flowchart of FIG. 1 according to one implementation of the present application.
Figure 2G:
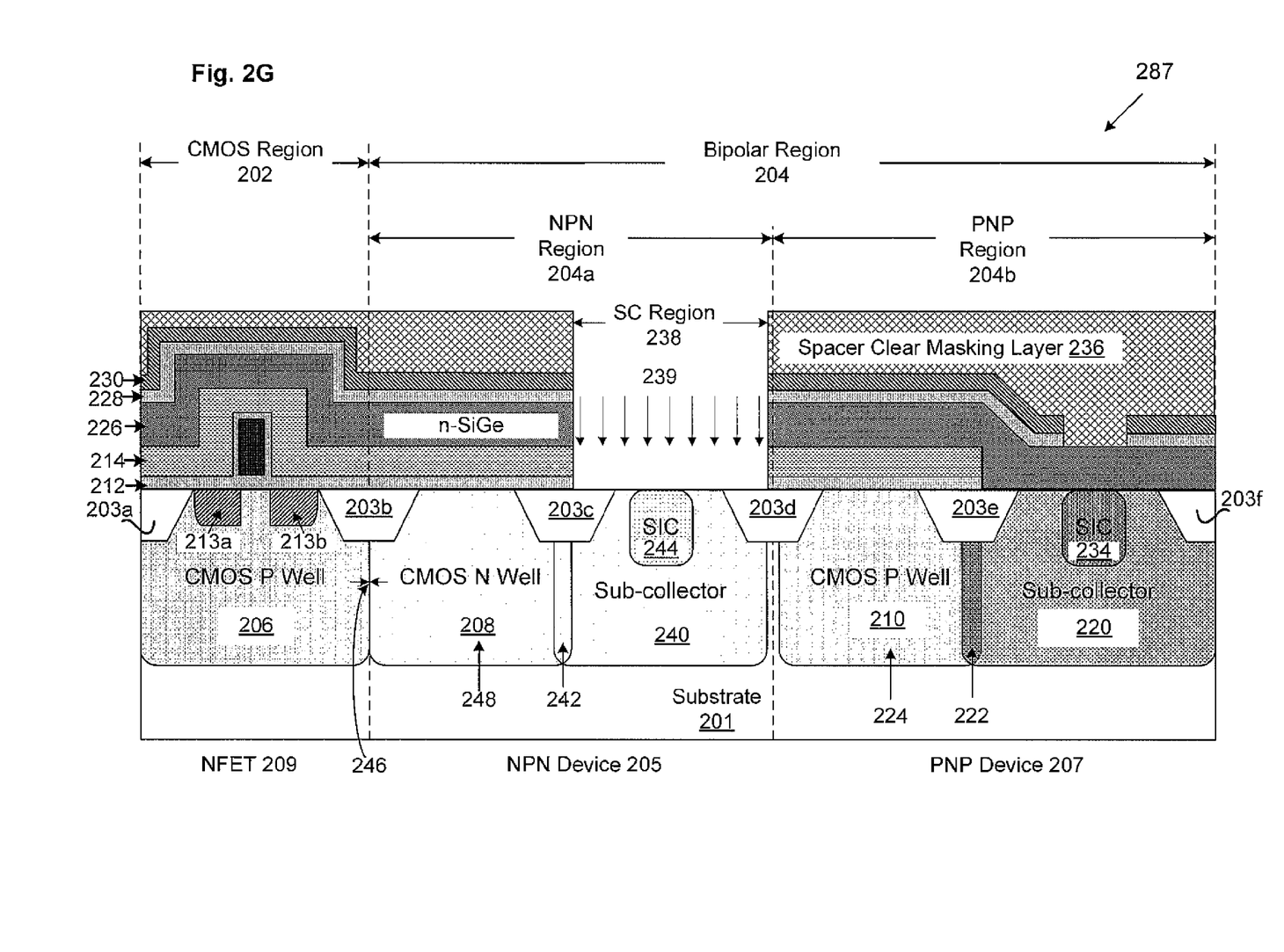
FIG. 2G illustrates a cross-sectional view of a portion of a semiconductor structure processed in accordance with an intermediate action in the flowchart of FIG. 1 according to one implementation of the present application.
Figure 2H:
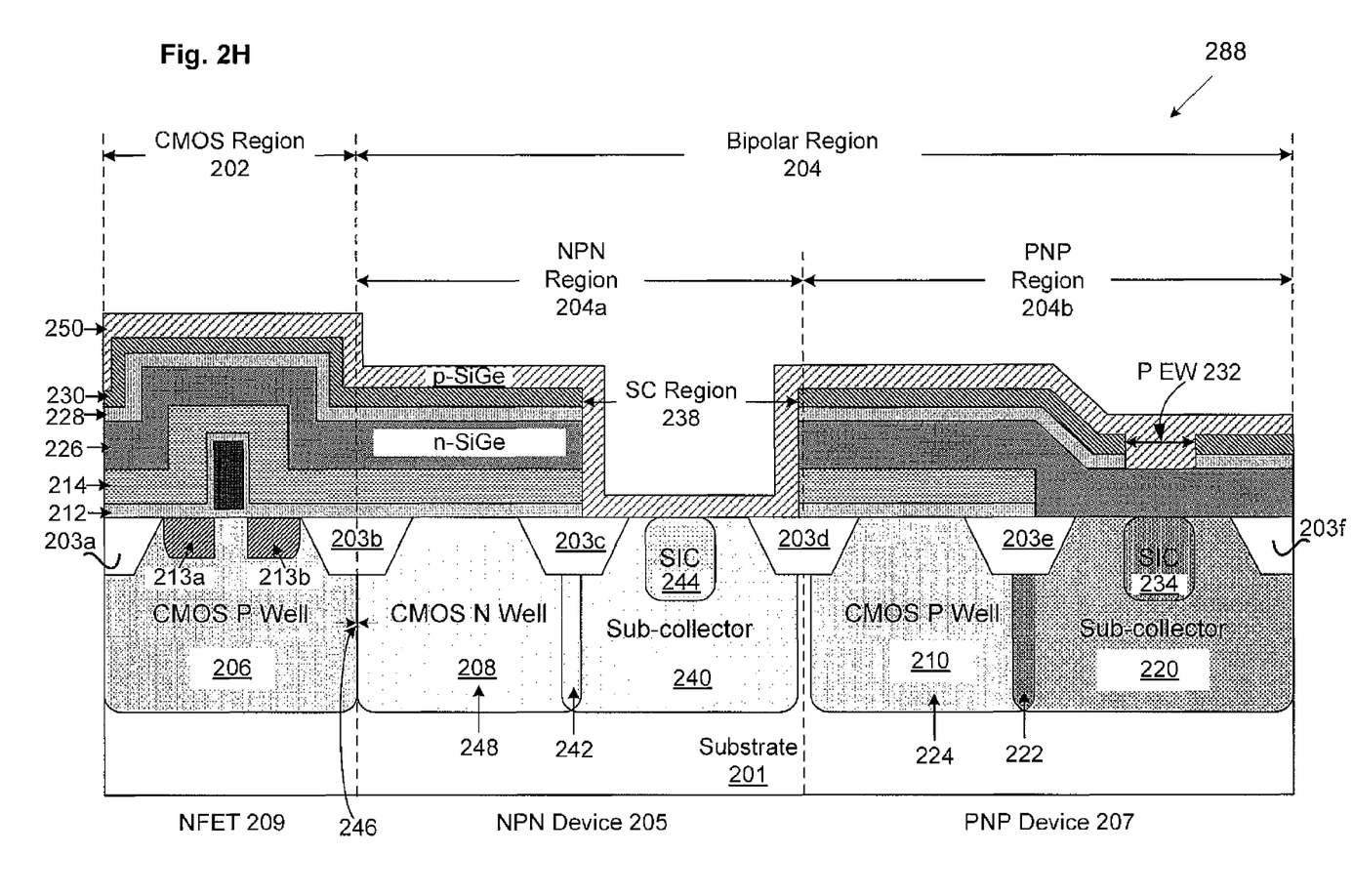
FIG. 2H illustrates a cross-sectional view of a portion of a semiconductor structure processed in accordance with an intermediate action in the flowchart of FIG. 1 according to one implementation of the present application.
Figure 2I:
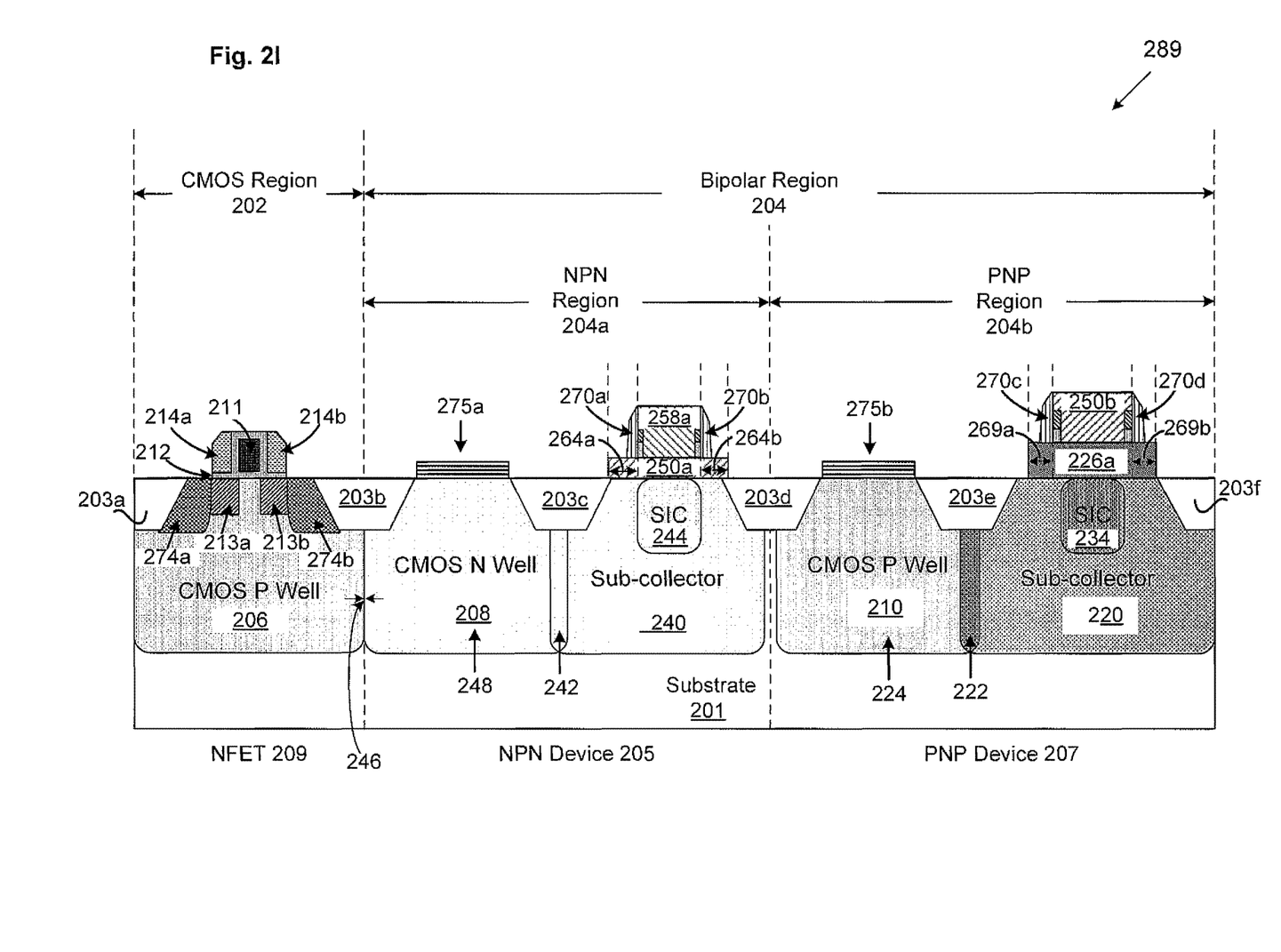
FIG. 2I illustrates a cross-sectional view of a portion of a semiconductor structure processed in accordance with a final action in the flowchart of FIG. 1 according to one implementation of the present application.

FIGS. 2A through 2I and structures 281 through 289 illustrate the result of performing actions 181 through 189 of flowchart 100 of FIG. 1, respectively, according to one implementation of the present disclosure. For example, structure 281 shows a semiconductor structure after action 181, structure 282 shows structure 281 after action 182, structure 283 shows structure 282 after action 183, and so forth. FIG. 2I illustrates a cross-sectional view of a portion of a semiconductor structure processed in accordance with final action 189 in flowchart 100 of FIG. 1, according to one implementation of the present disclosure.

Referring to FIG. 2A, structure 281 illustrates a cross-sectional view of a portion of a semiconductor device after completion of action 181 in flowchart 100 of FIG. 1, according to one implementation of the present disclosure. As shown in FIG. 2A, structure 281 includes semiconductor substrate 201, CMOS P well 206, CMOS N well 208, CMOS P well 210, and isolation regions 203*a*, 203*b*, 203*c*, 203*d*, 203*e* and 203*f*, gate electrode 211, lightly doped source region 213*a*, lightly doped drain region 213*b*, common spacer oxide layer 212 and common spacer nitride layer 214.

Semiconductor substrate 201 may include a lightly doped P type silicon or other appropriate substrate material. Isolation regions 203*a*, 203*b*, 203*c*, 203*d*, 203*e* and 203*f* are situated in semiconductor substrate 201, and may include shallow trench isolation (STI) regions having field oxide, such as silicon oxide. CMOS P well 206, CMOS N well 208 and CMOS P well 210 are formed in semiconductor substrate 201 in CMOS region 202, NPN region 204*a* and PNP region 204*b*, respectively. In the present implementation, CMOS P wells 206 and 210 may include a heavily doped P type implant. CMOS P well 206 can be utilized as a well region for N-channel field-effect transistor (NFET) 209. CMOS P well 210 can be utilized as a collector sinker for PNP device 207 in PNP region 204*b*. In the present implementation, CMOS N well 208 may include a heavily doped N type implant. CMOS N well 208 can be utilized as a collector sinker for NPN device 205 in NPN region 204*a*. As illustrated in FIG. 2A, CMOS P well 206 and CMOS N well 208 form p-n junction 246 to provide electrical isolation between NFET 209 and NPN device 205.

Although FIG. 2A illustrates the formations of CMOS P well 206, CMOS N well 208, CMOS P well 210, it should be understood that additional CMOS wells (not shown in FIG. 2A) can also be formed in both CMOS region 202 and bipolar region 204 of semiconductor substrate 201. For example, another CMOS N well can be formed in semiconductor substrate 201 adjacent to CMOS P well 206, where the CMOS N well and the CMOS P well can be utilized to respectively form a P-channel field-effect transistor (PFET) and an NFET (e.g., NFET 209) of a CMOS device.

As illustrated in FIG. 2A, structure 281 includes partially formed N-channel field-effect transistor (NFET) 209 having gate electrode 211, lightly doped source region 213*a* and lightly doped drain region 213*b*. Gate electrode 211 of NFET 209 is formed over CMOS P well 206. An oxide layer may be formed between gate electrode 211 and CMOS P well 206. Lightly doped source region 213*a* and lightly doped drain region 213*b* may be formed in CMOS P well 206 adjacent to gate electrode 211. For example, lightly doped source region 213*a* and lightly doped drain region 213*b* may include lightly doped N type dopant.

As further illustrated in FIG. 2A, common spacer oxide layer 212 and common spacer nitride layer 214 are successively formed over top surface 218 of semiconductor substrate 201 in CMOS region 202 and bipolar region 204. Common spacer oxide layer 212 can include tetraethylorthosilicate ("TEOS") oxide. Common spacer nitride layer 214 can include silicon nitride. Common spacer oxide layer 212 and/or common spacer nitride layer 214 can be formed over CMOS region 202 and bipolar region 204 of semiconductor substrate 201 by using a chemical vapor deposition ("CVD") process or other appropriate processes. As shown in FIG. 2A, in CMOS region 202, common spacer oxide layer 212 and common spacer nitride layer 214 also cover gate electrode 211 of NFET 209.

Referring now to FIG. 2B, structure 282 illustrates a cross-sectional view of a portion of a semiconductor device after completion of action 182 in flowchart 100 of FIG. 1, according to one implementation of the present disclosure. As shown in FIG. 2B, structure 282 includes spacer clear masking layer 215 formed over common spacer nitride layer 214 and common spacer oxide layer 212 in CMOS region 202 and bipolar region 204. Spacer clear masking layer 215 is patterned to form an opening over common spacer nitride layer 214 and common spacer oxide layer 212 to define spacer clear region 216 in PNP region 204*b* for PNP device 207. Spacer clear masking layer 215 may include photoresist or other appropriate masking material, and may be patterned in any manner known in the art. The patterned opening in spacer clear masking layer 215 helps define spacer clear region 216, in which portions of common spacer nitride layer 214 and common spacer oxide layer 212 may be removed in a subsequent processing action, while spacer clear masking layer 215 protects the rest of the regions in structure 282.

Referring now to FIG. 2C, structure 283 illustrates a cross-sectional view of a portion of a semiconductor device after completion of action 183 in flowchart 100 of FIG. 1, according to one implementation of the present disclosure. As shown in FIG. 2C, in structure 283, the portions of common spacer nitride layer 214 and common spacer oxide layer 212 not covered by spacer clear masking layer 215 in structure 282 of FIG. 2B are removed, such that the opening of spacer clear region 216 extends to top surface 218 of semiconductor substrate 201. As illustrated in FIG. 2C, spacer clear region 216 is substantially aligned with CMOS P well 210 in substrate 201 below. In one implementation, common spacer nitride layer 214 and common spacer oxide layer 212 may be removed by an etching process, for example, using a dilute hydrofluoric acid ("DHF") etchant or a buffered oxide etchant ("BOE"). In other implementations, common spacer nitride layer 214 and common spacer oxide layer 212 can be removed by any appropriate method known in the art. As can be seen in FIG. 2C, spacer clear masking layer 215 is used again to protect the rest of the regions over semiconductor substrate 201 during the removal of the portions of common spacer nitride layer 214 and common spacer oxide layer 212 in spacer clear region 216.

Referring now to FIG. 2D, structure 284 illustrates a cross-sectional view of a portion of a semiconductor device after completion of action 184 in flowchart 100 of FIG. 1, according to one implementation of the present disclosure. As shown in FIG. 2D, structure 284 includes spacer clear region 216, sub-collector 220 and selectively implanted collector (SIC) 234 of PNP device 207 formed in spacer clear region 216. While spacer clear masking layer 215 is still in place to protect the rest of the regions over semiconductor substrate 201, high energy spacer clear implant 219, such as high energy boron dopant or other appropriate P type high energy dopant, is implanted in semiconductor substrate 201 through the exposed top surface 218 in spacer clear region 216, thereby forming sub-collector 220 of PNP device 207. Also, SIC 234 having a highly p-doped local collector implant, which is closer to an interface between the sub-collector and the base of PNP device 207, is also formed, while spacer clear masking layer 215 is still in place to protect the rest of the regions over semiconductor substrate 201.

Thus, spacer clear masking layer 215 is utilized to define an opening in common spacer nitride layer 214 and common spacer oxide layer 212 to form spacer clear region 216, and to protect the rest of the regions over semiconductor substrate 201 during the formations of sub-collector 220 and SIC 234. The multi-use of spacer clear masking layer 215 saves manufacture cost and time, and allows the deposition of a silicon germanium (SiGe) layer in a subsequent action.

As further illustrated in FIG. 2D, the P type implant in CMOS P well 210 in PNP region 204b may be utilized as the extrinsic collector contact implant for PNP device 207. As such, CMOS P well 210 operates as collector sinker 224 for PNP device 207. Sub-collector 220, having high energy spacer clear implant 219, and collector sinker 224, having a heavily doped P type implant, may be in direct physical contact with and electrically connected to each other in overlapped region 222. Sub-collector 220 and collector sinker 224 may have substantially the same depth below top surface 218 in semiconductor substrate 201. Sub-collector 220 and collector sinker 224 form a direct electrical path for external connection for sub-collector 220 of PNP device 207.

Referring to FIG. 2E, structure 285 illustrates a cross-sectional view of a portion of a semiconductor device after completion of action 185 in flowchart 100 of FIG. 1, according to one implementation of the present disclosure. As shown in FIG. 2E, structure 285 includes N type SiGe layer 226 formed on top surface 218 of semiconductor substrate 201 in spacer clear region 216 and on common spacer nitride layer 214 over other regions of semiconductor substrate 201, after spacer clear masking layer 215 is removed. In one implementation, spacer clear masking layer 215 can be removed in a wet strip process known in the art. In other implementations, spacer clear masking layer 215 can be removed by using any appropriate method known in the art.

As illustrated in FIG. 2E, N type SiGe layer 226 is formed over CMOS region 202 and bipolar region 204 of semiconductor substrate 201, including spacer clear region 216. In the present implementation, N type SiGe layer 226 may be epitaxially grown over the exposed top surface 218 of semiconductor substrate 201 in spacer clear region 216. N type SiGe layer 226 forms a base for PNP device 207 in spacer clear region 216. In another implementation, N type SiGe layer 226 may have a graded structure. For example, grading the concentration of germanium in a silicon-germanium base builds into a bipolar device an electric field, which accelerates the carriers across the base, thereby increasing the speed of the heterojunction bipolar device compared to a silicon-only device. For example, a reduced pressure chemical vapor deposition technique, or RPCVD, may be used to fabricate a controlled grading of germanium concentration across the base layer.

It is noted that, up to action 185 of flowchart 100, the formations of sub-collector 220, SIC 234 and N type SiGe layer 226 as the base for PNP device 207 can be interchanged with the formations of a sub-collector, a SIC and a base for NPN device 205, by implanting dopants with reversed polarities in each of corresponding regions. For example, instead of forming sub-collector 220, SIC 234 and N type SiGe layer 226 for PNP device 207, a spacer clear region may be formed in NPN device 205, a vertical NPN sub-collector implant and a highly N-doped local collector implant may be performed, and a P type SiGe layer may be deposited over semiconductor substrate 201 to form a P type SiGe base for NPN device 205.

Referring to FIG. 2F, structure 286 illustrates a cross-sectional view of a portion of a semiconductor device after completion of action 186 in flowchart 100 of FIG. 1, according to one implementation of the present disclosure. As shown in FIG. 2F, structure 286 includes PNP emitter window 232 formed above SIC 234 of PNP device 207 in PNP region 204b. As illustrated in FIG. 2F, PNP base oxide layer 228 and undoped furnace poly layer 230 are formed over N type SiGe layer 226 covering an entire top surface thereof. PNP emitter window 232 is formed in undoped furnace poly layer 230 and PNP base oxide layer 228, and aligned with SIC 234 below. In one implementation, PNP emitter window 232 can be formed by depositing a mask over undoped furnace poly layer 230 to define an emitter window opening above SIC 234, and removing portions of undoped furnace poly layer 230 and PNP base oxide layer 228 by using an appropriate etching process to extend the emitter window opening to a top surface N type SiGe layer 226. In another implementation, PNP emitter window 232 may extend to a top surface of PNP base oxide layer 228. In one implementation, an optional organic antireflection coating layer (not explicitly shown in FIG. 2F) may be formed over undoped furnace poly layer 230 before the formation of PNP emitter window 232. The organic antireflection coating layer may enhance photolithographic control over the formation of PNP emitter window 232, and may be removed before any further processing action.

Referring to FIG. 2G, structure 287 illustrates a cross-sectional view of a portion of a semiconductor device after completion of action 187 in flowchart 100 of FIG. 1, according to one implementation of the present disclosure. As shown in FIG. 2G, structure 287 includes spacer clear region 238, sub-collector 240 and selectively implanted collector (SIC) 244 in NPN region 204a for NPN device 205. As illustrated in FIG. 2G, spacer clear masking layer 236 is formed over undoped furnace poly layer 230 to define and form spacer clear region 238 in NPN region 204a for NPN device 205. Spacer clear masking layer 236 may include photoresist or other appropriate masking material. The portions of undoped furnace poly layer 230, PNP base oxide layer 228, N type SiGe layer 226, common spacer nitride layer 214 and common spacer oxide layer 212 not covered by spacer clear masking layer 236 are removed by, for example, using an etching process to expose a portion of top surface 218 of semiconductor substrate 201 in spacer clear region 238. High energy spacer clear implant 239, such as high energy phosphorous dopant or other appropriate N type high energy dopant, is implanted in semiconductor substrate 201 in spacer clear region 238, thereby forming sub-collector 240 of NPN device 205, while spacer clear masking layer 236 protects the rest of the regions over semiconductor substrate 201. While spacer clear masking layer 236 is still in place, SIC 244 having a highly N-doped local collector implant, which is closer to an interface between the sub-collector and the base of NPN device 205, is also formed.

Thus, spacer clear masking layer 236 is utilized to define an opening in undoped furnace poly layer 230, PNP base oxide layer 228, N type SiGe layer 226, common spacer nitride layer 214 and common spacer oxide layer 212 to form spacer clear region 238, and to protect the rest of the regions over semiconductor substrate 201 during the formations of sub-collector 240 and SIC 244. The multi-use of spacer clear masking layer 236 saves manufacture cost and time, and allows the deposition of another silicon germanium (SiGe) layer in a subsequent action.

As further illustrated in FIG. 2G, the N type implant in CMOS N well 208 in NPN region 204a may be utilized as the extrinsic collector contact implant for NPN device 205. As such, CMOS N well 208 operates as collector sinker 248 for NPN device 205. Sub-collector 240 for NPN device 205 is spaced from and electrically insulated from collector sinker 224 of PNP device 207. On an opposite side, sub-collector 240 having high energy spacer clear implant 239 and collector sinker 248 having a heavily doped N type implant, may be in direct physical contact with and electrically connected to each other with each other in overlapped region 242. Sub-collector 240 and collector sinker 248 may have substantially the same depth below top surface 218 in semiconductor substrate 201. Sub-collector 240 and collector sinker 248 form a direct electrical path for external connection for sub-collector 240 of NPN device 205.

Referring now to FIG. 2H, structure 288 illustrates a cross-sectional view of a portion of a semiconductor device after completion of action 188 in flowchart 100 of FIG. 1, according to one implementation of the present disclosure. As shown in FIG. 2H, structure 288 includes P type SiGe layer 250 formed over the entire semiconductor substrate, including top surface 218 of semiconductor substrate 201 in spacer clear region 238, undoped furnace poly layer 230, and the exposed top surface of N type SiGe layer 226 in PNP emitter window 232, after spacer clear masking layer 236 is removed. In one implementation, spacer clear masking layer 236 can be removed in a similar manner as spacer clear masking layer 215 discussed above.

As shown in FIG. 2H, P type SiGe layer 250 forms a P type base for NPN device 205, and a P type emitter for PNP device 207. In the present implementation, P type SiGe layer 250 can be formed by using an appropriate deposition process such that P type SiGe layer 250 may be a single crystalline layer grown epitaxially over top surface 218 of semiconductor substrate 201 in spacer clear region 238, and a polycrystalline layer over undoped furnace poly layer 230 and in PNP emitter window 232. Thus, a portion of P type SiGe layer 250 in spacer clear region 238 over semiconductor substrate 201 can be used to form a single crystalline base for NPN device 205, and another portion of P type SiGe layer 250 in PNP emitter window 232 can be used to form a polycrystalline emitter for PNP device 207. In another implementation, P type SiGe layer 250 may have a graded structure. For example, grading the concentration of germanium in a silicon-germanium base builds into a bipolar device an electric field, which accelerates the carriers across the base, thereby increasing the speed of the heterojunction bipolar device compared to a silicon-only device. For example, a reduced pressure chemical vapor deposition technique, or RPCVD, may be used to fabricate a controlled grading of germanium concentration across the base layer.

Referring to FIG. 2I, structure 289 illustrates a cross-sectional view of a portion of a semiconductor device after completion of action 189 in flowchart 100 of FIG. 1, according to one implementation of the present disclosure. As shown in FIG. 2I, structure 289 includes NFET 209 in CMOS region 202, NPN device 205 in NPN region 204a, and PNP device 207 in PNP region 204b. Specifically, N type emitter 258a of NPN device 205, and source region 274a and drain region 274b of NFET 209 are, among other things, formed in action 189.

As illustrated in FIG. 2I, NFET 209 includes CMOS P well 206, gate electrode 211, common spacer oxide layer 212, spacers 214a and 214b, lightly doped source region 213a, lightly doped drain region 213b, source region 274a and drain region 274b. CMOS P well 206 is situated between isolation regions 203a and 203b in CMOS region 202. Gate electrode 211 is situated over CMOS P well 206 on common spacer oxide layer 212 in CMOS region 202. For example, gate electrode 211 includes polycrystalline silicon. Spacers 214a and 214b are situated adjacent to gate electrode 211 and over CMOS P well 206 in CMOS region 202. In the present implementation, spacers 214a and 214b include silicon nitride. In other implementations, spacers 214a and 214b can include silicon oxide or other appropriate dielectric material. Spacers 214a and 214b can be formed by depositing a conformal common spacer layer, such as a silicon oxide and/or silicon nitride layer, over CMOS region 202 and bipolar region 204 of semiconductor substrate 201. The layer of dielectric material can then be etched back using an anisotropic etching process to form spacers 214a and 214b. Lightly doped source region 213a and lightly doped drain region 213b are formed adjacent to gate electrode 211 in CMOS P well 206 in CMOS region 202. Lightly doped source region 213a and lightly doped drain region 213b include lightly doped N type regions. Source region 274a and drain region 274b are formed in CMOS region 202 of semiconductor substrate 201. Source region 274a is situated in CMOS P well 206 between isolation region 203a and lightly doped source region 213a. Drain region 274b is situated in CMOS P well 206 between isolation region 203b and lightly doped drain region 213b.

As illustrated in FIG. 2I, NPN device 205 includes N type emitter 258a, NPN emitter spacers 270a and 270b, P type base 250a, SIC 244, N type sub-collector 240, collector sinker 248 and collector contact 275a. In the present implementation, NPN device 205 is a vertical heterojunction bipolar transistor. N type emitter 258a is situated between NPN emitter spacers 270a and 270b and over P type base 250a in NPN region 204a. N type emitter 258a can include N type polycrystalline silicon, which can be doped with phosphorus or other appropriate N type dopant. Heavily doped extrinsic base regions 264a and 264b are situated in P type base 250a adjacent to N type emitter 258a in semiconductor substrate 201 in NPN region 204a. Sub-collector 240 and SIC 244 of NPN device 205 are formed in NPN region 204a. As illustrated in FIG. 2I, sub-collector 240 and collector sinker 248 may have substantially the same depth below top surface 218 in semiconductor substrate 201. Sub-collector 240 having an N type high energy spacer clear implant partially overlaps collector sinker 248 having heavily doped N type implant in overlapped region 242. Sub-collector 240 and collector sinker 248 form a direct electrical path for external connection using collector contact 275a of NPN device 205. In the present implementation, CMOS P well 206 for NFET 209 and collector sinker 248 formed using CMOS N well 208 form p-n junction 246 in semiconductor substrate 201, where p-n junction 246 provides electrical isolation between NFET 209 and NPN device 205 in semiconductor substrate 201. As such, CMOS P well 206 for NFET 209 and collector sinker 248 of NPN device 205 need not be placed apart from each other, thereby saving usable space on semiconductor substrate 201.

As illustrated in FIG. 2I, PNP device 207 includes P type SiGe emitter 250b, PNP emitter spacers 270c and 270d, N type SiGe base 226a, SIC 234, P type sub-collector 220, collector sinker 224 and collector contact 275b. In the present implementation, PNP device 207 is a vertical heterojunction bipolar transistor. P type SiGe emitter 250b is situated between PNP emitter spacers 270c and 270d and over N type SiGe base 226a in PNP region 204b. Heavily doped extrinsic base regions 269a and 269b are situated in N type SiGe base 226a adjacent to P type SiGe emitter 250b in PNP region 204b. Sub-collector 220 and SIC 234 of PNP device 207 are formed in PNP region 204b. As illustrated in FIG. 2I, sub-collector 220 and collector sinker 224 may have substantially the same depth below top surface 218 in semiconductor substrate 201. Sub-collector 220 having a P type high energy spacer clear implant partially overlaps collector sinker 224 having a heavily doped P type implant in overlapped region 222. Sub-collector 220 and collector sinker 224 form a direct electrical path for external connection using collector contact 275b of PNP device 207. In the present implementation, collector sinker 224 of PNP device 207 and sub-collector 240 of NPN device 205 are spaced apart from each other to provide electrical isolation between PNP device 207 and NPN device 205. In another implementation, collector sinker 224 of PNP device 207 and sub-collector 240 of NPN device 205 may be placed immediately adjacent to each other.

Although FIGS. 2A-2I illustrate the formations of CMOS P well 206, CMOS N well 208, CMOS P well 210, NFET 209, NPN device 205 and PNP device 207 in the present implementation, it should be understood that, in another implementation according to the present inventive concepts, the above-mentioned regions can be interchanged with the formations of a CMOS N well, CMOS P well, CMOS N well, a PFET, a PNP device and an NPN device, by implanting dopants with reversed polarities in each of the corresponding regions.

The present inventive concepts utilize a spacer clear masking layer to define and form a spacer clear region in a bipolar region of a semiconductor substrate, a sub-collector and a selectively implanted collector of a bipolar device in the spacer clear region of the semiconductor substrate. In addition, the spacer clear masking layer allows the deposition of an epitaxial silicon-germanium base layer in the spacer clear region in a subsequent step of the BiCMOS process flow to form a base of the bipolar device. The multi-use of the spacer clear masking layer saves both manufacture cost and time.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A bipolar complementary-metal-oxide-semiconductor (BiCMOS) device comprising:
    a CMOS device in a CMOS region;
    a PNP bipolar device in a bipolar region;
    a spacer clear region defined by an opening in a common spacer layer over said CMOS region and said bipolar region, wherein a sub-collector, a selectively implanted collector, and a base of said PNP bipolar device are formed in said spacer clear region, wherein a width of said sub-collector of said PNP bipolar device is substantially defined by said opening;
    a collector sinker directly adjoining said spacer clear region and electrically connected to said sub-collector of said PNP bipolar device.

2. The BiCMOS device of claim 1, wherein said base of said PNP bipolar device comprises silicon germanium (SiGe).

3. The BiCMOS device of claim 1, wherein said sub-collector of said PNP bipolar device comprises a high energy spacer clear implant.

4. The BiCMOS device of claim 1, further comprising an NPN bipolar device in said bipolar region.

5. The BiCMOS device of claim 4, wherein said NPN bipolar device comprises a sub-collector, a selectively implanted collector and a base in another spacer clear region.

6. The BiCMOS device of claim 4, wherein said base of said NPN bipolar device comprises silicon germanium (SiGe).

7. The BiCMOS device of claim 4, wherein said NPN bipolar device comprises another collector sinker adjacent to another spacer clear region and electrically connected to a sub-collector of said NPN bipolar device.

8. The BiCMOS device of claim 1, wherein said CMOS device is an N-channel field-effect transistor (NFET).

9. The BiCMOS device of claim 1, wherein said common spacer layer comprises silicon nitride.

10. A bipolar complementary-metal-oxide-semiconductor (BiCMOS) device comprising:
    a CMOS device in a CMOS region;
    a PNP bipolar device in a bipolar region;
    a spacer clear region defined by an opening in a common spacer layer over said CMOS region and said bipolar region, wherein a collector, and a base of said PNP bipolar device are formed in said spacer clear region, wherein a width of said collector of said PNP bipolar device is substantially defined by said opening;
    a collector sinker directly adjoining said spacer clear region and electrically connected to said collector of said PNP bipolar device.

11. The BiCMOS device of claim 10, wherein said base of said PNP bipolar device comprises silicon germanium (SiGe).

12. The BiCMOS device of claim 10, further comprising an NPN bipolar device in said bipolar region.

13. The BiCMOS device of claim 12, wherein said NPN bipolar device comprises a collector and a base in another spacer clear region.

14. The BiCMOS device of claim 12, wherein said base of said NPN bipolar device comprises silicon germanium (SiGe).

15. The BiCMOS device of claim 12, wherein said NPN bipolar device comprises another collector sinker adjacent to another spacer clear region and electrically connected to a collector of said NPN bipolar device.

16. The BiCMOS device of claim 10, wherein said CMOS device is an N-channel field-effect transistor (NFET).

17. The BiCMOS device of claim 10, wherein said common spacer layer comprises silicon nitride.

* * * * *